(12) United States Patent
Lee

(10) Patent No.: US 8,062,568 B2
(45) Date of Patent: Nov. 22, 2011

(54) NANO PATTERN WRITER

(75) Inventor: Kwangyeol Lee, Namyangju-si (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 12/548,959

(22) Filed: Aug. 27, 2009

(65) Prior Publication Data

US 2011/0049760 A1    Mar. 3, 2011

(51) Int. Cl.
   *B29C 33/00*      (2006.01)
   *B29C 59/02*      (2006.01)
   *B05D 3/12*      (2006.01)

(52) U.S. Cl. .... 264/219; 264/40.1; 264/400; 427/248.1; 427/405; 425/385; 425/177; 977/887

(58) Field of Classification Search .................. 264/40.1, 264/219, 400; 427/248.1, 405; 425/385, 425/177; 977/887
See application file for complete search history.

(56) References Cited

U.S. PATENT DOCUMENTS

| 6,404,555 | B1 * | 6/2002 | Nishikawa | 359/619 |
|---|---|---|---|---|
| 6,757,116 | B1 | 6/2004 | Curtiss et al. | |
| 7,335,594 | B1 | 2/2008 | Wang et al. | |
| 7,348,274 | B2 * | 3/2008 | Chung et al. | 438/679 |
| 7,780,431 | B2 * | 8/2010 | Yu et al. | 425/385 |
| 2004/0065976 | A1 * | 4/2004 | Sreenivasan et al. | 264/171.1 |
| 2005/0035983 | A1 * | 2/2005 | Cruchon-Dupeyrat et al. | 346/140.1 |
| 2005/0094327 | A1 | 5/2005 | Okuno et al. | |
| 2007/0020773 | A1 | 1/2007 | Kornilovich et al. | |
| 2007/0175860 | A1 | 8/2007 | Liu | |
| 2009/0289029 | A1 * | 11/2009 | Vecchione et al. | 216/13 |
| 2010/0120196 | A1 * | 5/2010 | Chao et al. | 438/99 |
| 2010/0130005 | A1 * | 5/2010 | Lee et al. | 438/652 |
| 2010/0305516 | A1 * | 12/2010 | Xu et al. | 604/272 |
| 2010/0310773 | A1 * | 12/2010 | Yoshida et al. | 427/304 |

FOREIGN PATENT DOCUMENTS

JP     2009023132 A   *   2/2009

OTHER PUBLICATIONS

Australian Patent Office, International Search Report and Written Opinion in related PCT application No. PCT/KR2010/005757 which is related to the present matter; mailed Nov. 16, 2010.

\* cited by examiner

*Primary Examiner* — Joseph Del Sole
*Assistant Examiner* — Nahida Sultana
(74) *Attorney, Agent, or Firm* — Workman Nydegger

(57) ABSTRACT

A method for manufacturing a nano pattern writer includes forming one or more grooves on a first layer, depositing a substance on the first layer to form a film on the first layer, polishing the film on the first layer to thereby form a patterned film that fills the one or more grooves on the first layer, placing a second layer over the patterned film to thereby form a layered structure interposing the patterned film between the first layer and the second layer, and removing a part of the first layer and the second layer to thereby expose portions of the patterned film.

17 Claims, 8 Drawing Sheets

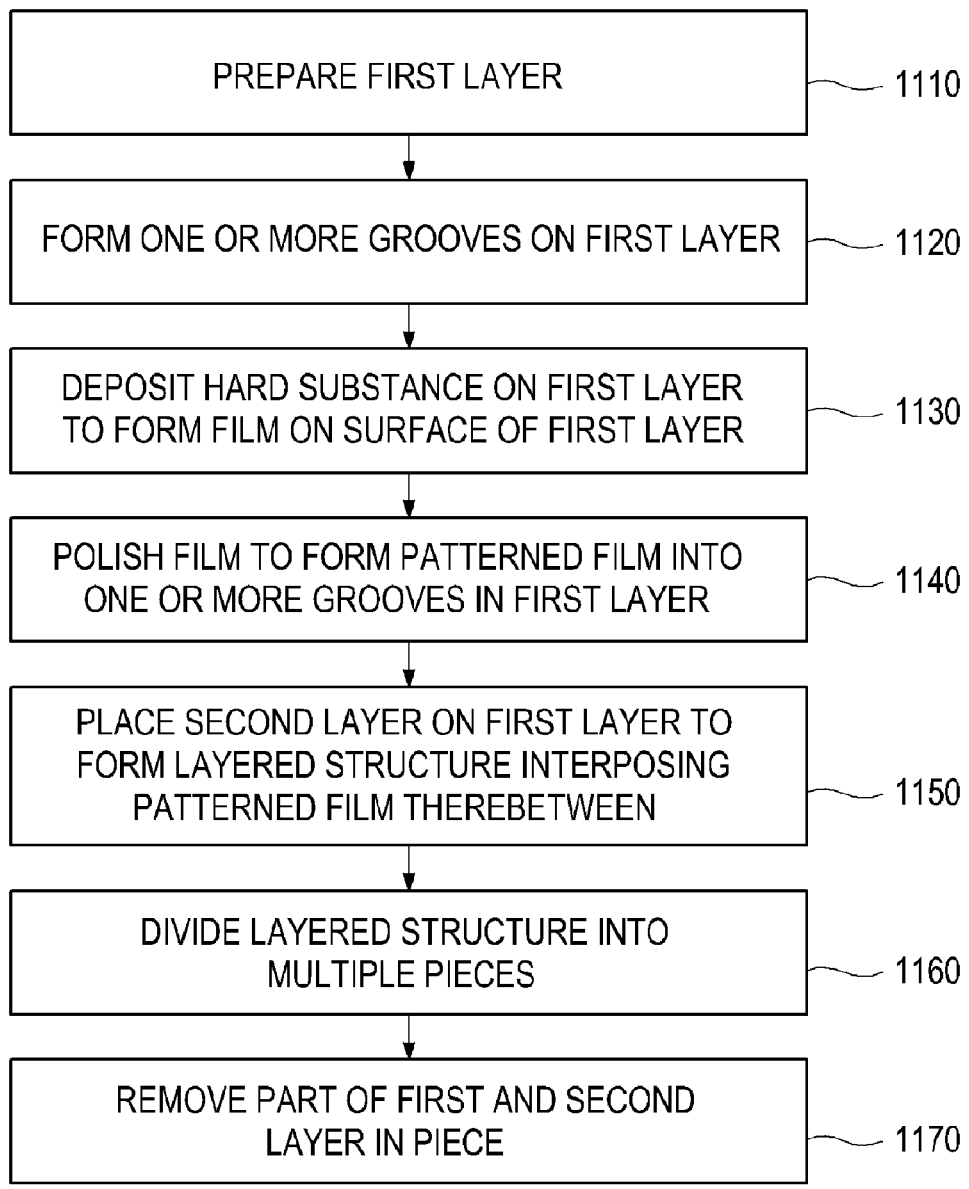

NANO PATTERN WRITER

BACKGROUND

Recent developments in nano technology have broadened the application area of nano structures due to the superior properties achievable from nano patterns of nano structures. Nano patterns (e.g., size, shape) formed on a plate may determine the properties (e.g., antifouling, antireflective, reflective, sticking, non-sticking, bio-compatible, etc.) of the plate. Such nano patterns may also facilitate the implementation of nano-scale devices, e.g., having a nano-patterned conducting line therein. Conventional techniques for forming nano patterns involve complex processes such as optical lithography, plasma etching, e-beam lithography or the like, but fail to achieve sufficiently fine patterns of a nano structure.

SUMMARY

Devices, methods and techniques for a nano pattern writer are provided. In one embodiment, a method of manufacturing a nano pattern writer includes forming one or more grooves on a first layer, depositing a substance on the first layer to form a film on the first layer, polishing the film on the first layer to thereby form a patterned film that fills the one or more grooves on the first layer, placing a second layer over the patterned film to thereby form a layered structure interposing the patterned film between the first layer and the second layer, and removing a part of the first layer and the second layer to thereby expose portions of the patterned film.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

FIG. 11 is a flow diagram of an illustrative embodiment of a method for manufacturing a nano pattern writer.

DETAILED DESCRIPTION

Figure 1:
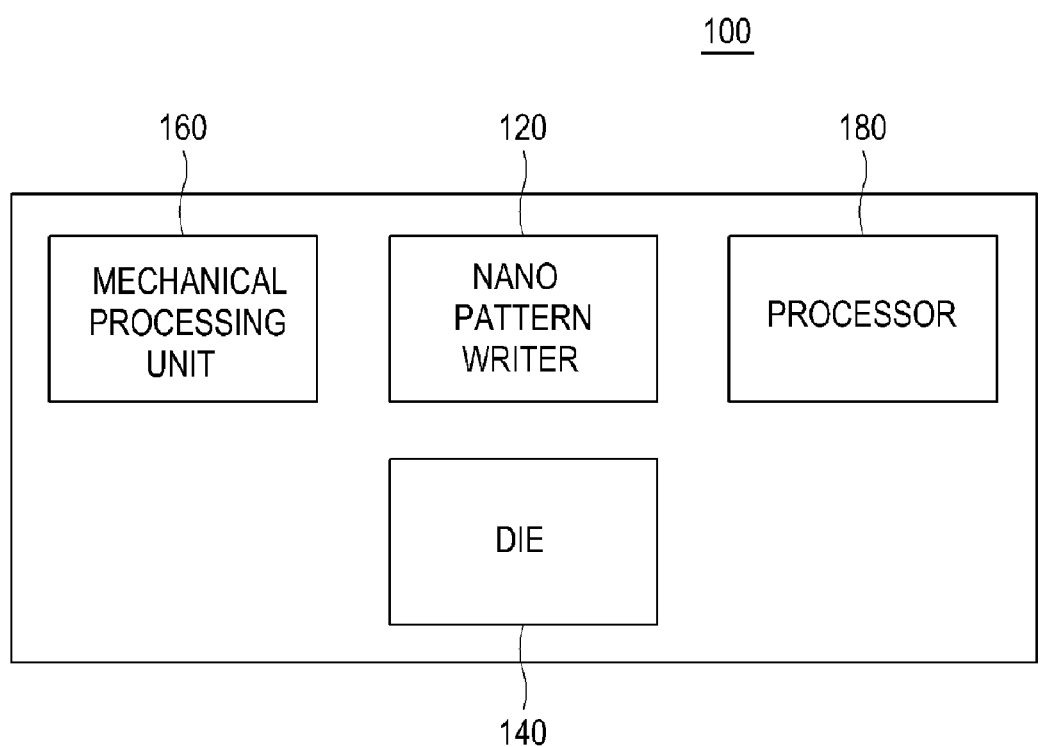
FIG. 1 shows a schematic diagram of an illustrative embodiment of a nano pattern writing device.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1 shows a schematic diagram of an illustrative embodiment of a nano pattern writing device 100. As depicted, nano pattern writing device 100 may include a nano pattern writer 120, a die 140, a mechanical processing unit 160, and a processor 180. Mechanical processing unit 160 may be configured to move and position a plate (not shown) to be patterned. Mechanical processing unit 160 may also be configured to move and position nano pattern writer 120. Depending on the processing procedure to be utilized (e.g., etching, scratching, etc.), mechanical processing unit 160 may move or position the plate, nano pattern writer 120, or the plate and nano pattern writer 120. For example, mechanical processing unit 160 may include a robot arm (not shown) that is configured to position the plate (e.g., a semiconductor substrate) onto a surface of die 140. The robot arm may press and/or move nano pattern writer 120 onto a surface of the plate placed on die 140 to thereby form a nano pattern (e.g., to scratch the surface of the plate). Alternatively, mechanical processing unit 160 may be operated to press nano pattern writer 120 against the surface of the plate to be patterned without moving nano pattern writer 120 and the plate in any direction (e.g., in a vertical direction), to thereby form a nano pattern (e.g., an array of points) on the surface of the plate. Mechanical processing unit 160 may be further configured to move nano pattern writer 120 in, for example, a vertical or a horizontal direction relative to a direction in which the plate extends, to thereby form a nano pattern (e.g., an array of lines) on the surface of the plate using nano pattern writer 120. Mechanical processing unit 160 may include, without limitation, one or more moving units including a robot arm, a motor, a conveyer belt or combinations thereof.

Processor 180 may be configured to control the overall operations of nano pattern writing device 100. For example, processor 180 may be configured to receive input from a user (e.g., an operator) to operate mechanical processing unit 160, and to display the operation status of nano pattern writing device 100 for viewing by the user. Processor 180 may include microprocessors, digital signal processors (DSPs), microcontrollers, or the like. At least one system memory may be embedded in or coupled to processor 180 to store software applications, including an operating system, at least one application program, or other program modules for execution by processor 180.

Die 140 may be provided for placing a plate to be patterned thereupon. Die 140 may be configured to hold the plate when nano pattern writer 120 is placed in contact with a surface of the plate on die 140. Die 140 may be further configured to mount the plate to facilitate the performing of a nano pattern forming process upon the mounted plate using nano pattern writer 120. Die 140 may be designed based at least in part on the size of the plate so as to secure the plate when nano pattern writer 120 is placed in contact with the surface thereof. The plate may be positioned on die 140, e.g., using mechanical processing unit 160. Once the plate is positioned on die 140, nano pattern writer 120 may apply a predetermined amount of pressure on the plate. The amount of predetermined pressure may be proportional to, e.g., the weight of nano pattern writer 120. Nano pattern writer 120 may be integrated with die 140 as a single operating component of nano pattern writing device 100.

Figure 2:
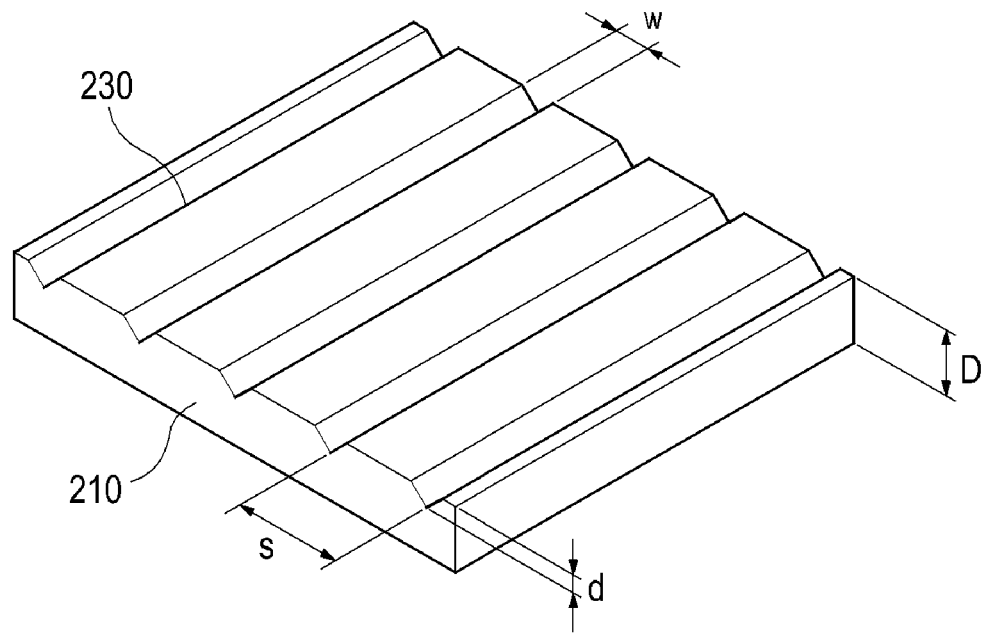
FIG. 2 shows a perspective view of an illustrative embodiment of a first layer of a nano pattern writer.

FIGS. 2 to 7 show example stages of a nano pattern writer, such as nano pattern writer 120, during the fabrication of the nano pattern writer. The nano pattern writer may have an array of nano needles to scratch a surface of a plate to be patterned. In some embodiments, the nano pattern writer may be a comb-like nano pattern scratcher. FIG. 2 shows a perspective view of an illustrative embodiment of a first layer 210 of a nano pattern writer (e.g., nano pattern writer 120 of FIG. 1). As depicted, first layer 210 includes one or more grooves 230 that are substantially parallel to one another. First layer 210 may have a predetermined depth "D" ranging from about 15 nm (nanometer) to about 30 nm, from about 20 nm to about 50 nm, from about 30 nm to about 70 nm, or from about 50 nm to about 100 nm. First layer 210 may include one or more grooves 230 which extend along a length of first layer 210. In one embodiment, first layer 210 or sections of first layer 210 may be partially removed to form one or more grooves 230 using any of a variety of etching techniques that are generally well-known to those of ordinary skill in semiconductor processing, MEMS processing, or nano technology fields. For example, an anisotropic chemical wet etching technique may be used to etch first layer 210 made of GaAs in a phosphoric acid hydrogen peroxide solution according to the mechanism given in the reaction equation as follows: $GaAs+H_3PO_4+4H_2O_2 \rightarrow GaPO_4+H_3AsO_4+4H_2O$.

In one embodiment, first layer 210 may have one or more grooves 230 that are arranged to have a predetermined pattern (e.g., multiple parallel line patterns). Any of a variety of well-known photolithography techniques (or other equivalent methods) may be used to define a pattern of one or more groves 230. In one embodiment, a photoresist layer (not shown) may be formed on first layer 210. The photoresist layer may then be processed using any one of the aforementioned photolithography techniques, to thereby selectively remove parts of the photoresist layer on first layer 210. Exposed parts of first layer 210 may then be etched (e.g., using an anisotropic chemical wet etching), to thereby form one or more grooves 230. The photoresist layer may be removed, e.g., using a plasma containing oxygen. In this way, one or more grooves 230 may be formed on first layer 210, as depicted in FIG. 2. In one embodiment, one or more grooves 230 formed on first layer 210 may be disposed in a substantially uniform manner having a predetermined center-to-center spacing "s" between adjacent grooves. The center-to-center spacing "s" may be determined based on the desired nano patterns to be formed. In some embodiments, the center-to-center spacing "s" may range from about 10 nm to about 20 nm, from about 20 nm to about 50 nm, from about 30 nm to about 100 nm, or from about 100 nm to about 1000 nm. As the predetermined center-to-center spacing "s" of nano pattern writer 120 becomes wider, the spacing of the lines in the nano pattern formed by nano pattern writer 120 may become larger. It should be appreciated that although FIG. 2 shows one or more grooves 230 that extend linearly with a substantially uniform center-to-center spacing between two adjacent grooves, depending on the design specifications, one or more grooves 230 may be disposed in varying directions having various patterns, and/or varying center-to-center spacings "s" (e.g., one pair of two adjacent grooves may be spaced closer together than another pair of two adjacent grooves).

One or more grooves 230 may have cross-sectional shapes that can vary based on the design requirements/specifications of nano pattern writer 120 to be used in nano pattern writing device 100. For example, one or more grooves 230 may have a substantially triangle-shaped cross-section. As depicted in FIG. 2, the cross-section of one or more grooves 230 may be in a shape of a sharp bottomed triangle having a predetermined width "w" and a predetermined depth "d" that can be defined based on the dimension/scale of the nano pattern to be fabricated using nano pattern writer 120. For example, the width "w" and depth "d" of grooves 230 may have a value that is determined based on a width of a line in the nano pattern to be formed using nano pattern writer 120. As the width "w" and depth "d" of grooves 230 in nano pattern writer 120 becomes larger, the width of the line in the nano pattern formed by nano pattern writer 120 may become larger. In some embodiments, the width "w" may range from about 5 nm to about 10 nm, from about 10 nm to about 15 nm, from about 10 nm to about 20 nm, from about 10 nm to about 50 nm, from about 15 nm to about 100 nm, or from about 100 nm to about 1000 nm. In other embodiments, the width "w" may be about 5 nm, about 10 nm, about 15 nm, about 20 nm, about 50 nm, or about 100 nm. In some embodiments, the depth "d" may range from about 5 nm to about 20 nm, from about 10 nm to about 30 nm, from about 20 nm to about 50 nm, from about 15 nm to about 100 nm, or from about 100 nm to about 1000 nm. In other embodiments, the depth "d" may be about 5 nm, about 10 nm, about 20 nm, about 50 nm, or about 100 nm.

Figure 3:
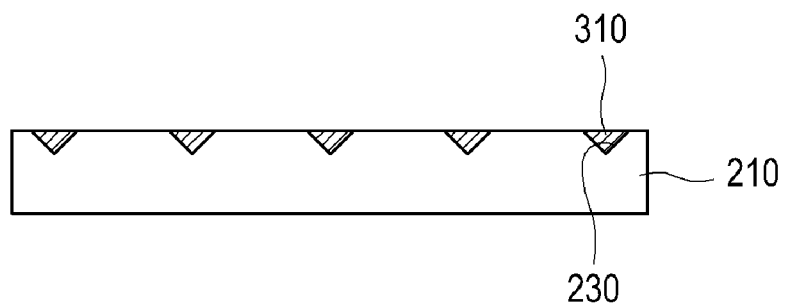
FIG. 3 shows a cross sectional diagram of the first layer illustrated in FIG. 2.

FIG. 3 shows a cross sectional diagram of first layer 210 of FIG. 2 on which a film made of a hard substance fills grooves 230. In one embodiment, the hard substance fills the patterned grooves 230 so as to form an array of nano needles 310. Nano needles 310 may be made of or include any type of hard substance having a predetermined hardness sufficient to scratch a surface of a plate to be patterned with nano pattern writer 120. For example, nano needles 310 may be made of any of a variety of materials having a hardness greater than or equal to about 7 on the Mohs scale. Nano needles 310 may be made of a hard material including, but not limited to, quartz, tungsten, tungsten carbide, tantalum carbide, or diamond. In another embodiment, nano needle 310 may be made of, titanium alloys such as Ti-6Al-4V, Ti-6Al-6V-2Sn, Ti-6Al-2Sn-4Zr-6Mo, Ti-10V-2Fe-3Al, Ti-7Al-4Mo, Ti-5Al-2.5Sn, Ti-6Al-5Zr-0.5Mo-0.2Si, Ti-5.5Al-3.5Sn-3Zr-0.3Mo-1Nb-0.3Si, Ti-8Al-1Mo-1V, Ti-6Al-2Sn-4Zr-2Mo, Ti-5Al-2Sn-2Zr-4Mo-4Cr, Ti-11.5Mo-6Zr-4.5Sn, Ti-15V-3Cr-3Al-3Sn, Ti-15Mo-5Zr-3Al, Ti-15Mo-5Zr, Ti-13V-11Cr-3Al, or the like.

The hard substance may be deposited on a surface of first layer 210 to fill one or more grooves 230. The film of hard substance may be deposited on the surface of first layer 210 using any of a variety of well-known coating techniques including, but not limited to, sputter deposition, plasma spraying, thermal spraying, vacuum deposition, or the like. In one embodiment, the deposited film may be polished using any of a variety of well-known polishing techniques to form a patterned film that fills one or more grooves 230. The polishing techniques may include, but are not limited to, chemical-mechanical polishing (CMP), vapor polishing, flame polishing, or the like. During the polishing process, the film is formed on the surface of first layer 210. The film is then rubbed to remove portions of the film that are formed between one or more grooves 230 (e.g. on a flat surface of first layer 210 between grooves 230). This rubbing process in some embodiments leaves a part of the film disposed within one or more grooves 230. The part of the film that fills one or more grooves 230 may have a height that is substantially identical to or less than the depth "d" of one or more grooves 230. In this way, the film may fill one or more grooves 230 of first layer 210. The film of hard substance may form an array of nano needles 310 extending along a length of first layer 210. In other embodiments, nano needles 310 may also have substantially uniform heights.

Figure 4:
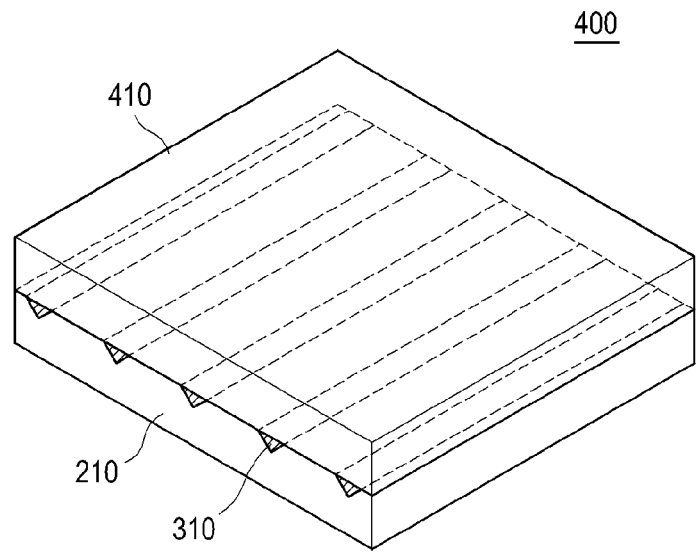
FIG. 4 shows a perspective view of the first layer illustrated in FIG. 2 on which a second layer is positioned to form a layered structure with a film interposed between the first and second layers.

FIG. 4 shows a perspective view of first layer 210 on which a second layer 410 is positioned. As depicted, second layer 410 may be placed on top of first layer 210 having one or more grooves 230 filled with a film to thereby form a layered structure 400. Layered structure 400 includes first layer 210 and second layer 410 with an array of nano needles 310. In some embodiments, nano needles 310 are formed from the film interposed between first layer 210 and second layer 410. Second layer 410 may be deposited on first layer 210 using any of a variety of well-known deposition techniques including, but not limited to, chemical vapor deposition (CVD), physical vapor deposition (PVD) or the like. During the deposition process, layered structure 400 may be pressed while being heated to ensure good adhesion between first layer 210 and second layer 410. In one embodiment, first layer 210 and second layer 410 may be made from a variety of semiconductor materials including, but not limited to, Silicon (Si), Gallium Arsenide (GaAs), Silicon-On-Insulator (SOI), GaAs/AlAs/SiGaAs, AlGaN/GaN/Si, or the like. Alternatively, first layer 210 and second layer 410 may be made of a non-semiconductor material. In some embodiments, the material may be selected based on certain characteristics or properties of the material such as flexibility, dimension, cost, durability, etc. Second layer 410 may be made of a material that is the same as or different from the material of first layer 210.

Figure 5:
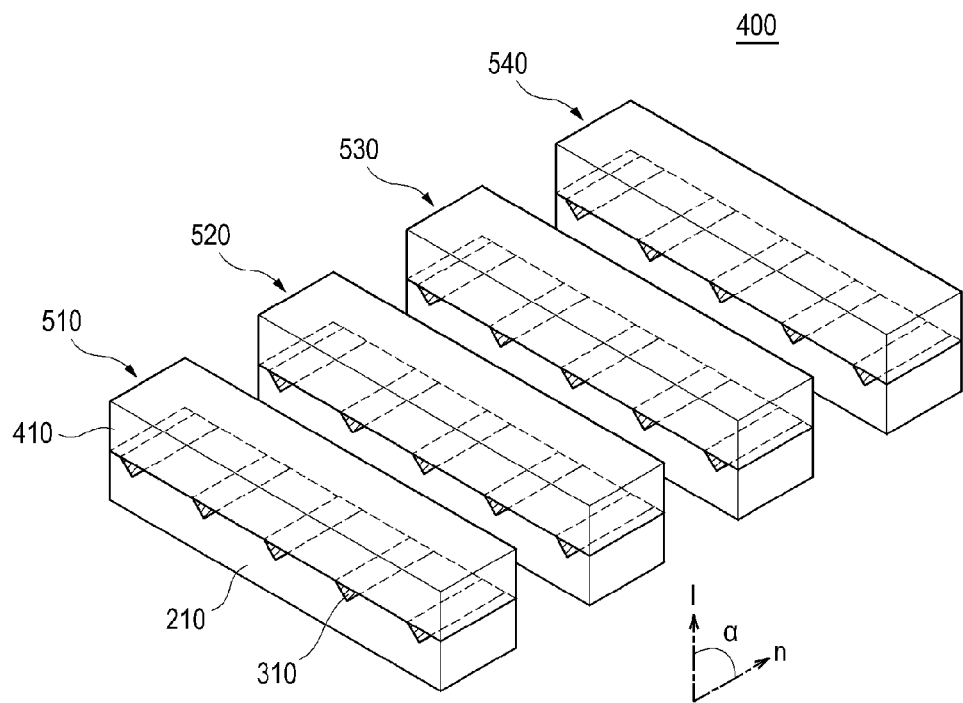
FIG. 5 shows a perspective view of the layered structure illustrated in FIG. 4 cut into four pieces.

FIG. 5 shows a perspective view of layered structure 400 of FIG. 4 that is cut into multiple pieces. As depicted, layered structure 400, composed of first layer 210 and second layer 410, may be divided into 4 pieces 510, 520, 530, 540. FIG. 5 depicts layered structure 400 cut into four pieces only for convenience of description, and one skilled in the art will appreciate that layered structure 400 may be cut into a different number of pieces. A razor blade or other appropriate cutting instrument may be used to separate layered structure 400 into pieces 510, 520, 530, 540. As depicted in FIG. 5, layered structure 400 may be cut vertically along the "l" axis, which is substantially perpendicular to a base of layered structure 400 as denoted by the "n" axis (i.e. cutting angle α formed by the "l" axis and the "n" axis is about 90 degrees). Alternatively, layered structure 400 may be cut along the "l" axis such that the cutting angle α formed by the "l" axis and the "n" axis forms an acute angle. That is, the cutting angle α between the "l" axis and the "n" axis in which nano needles 310 are aligned may be less than 90 degrees.

Figure 6:
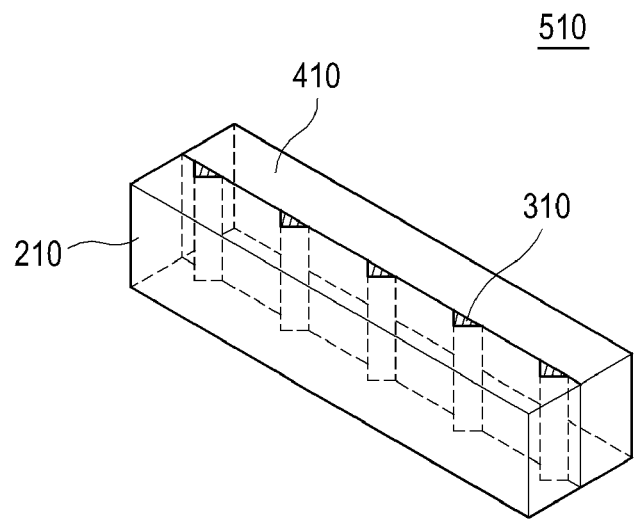
FIG. 6 shows a perspective view of one of the four pieces illustrated in FIG. 5.
Figure 7:
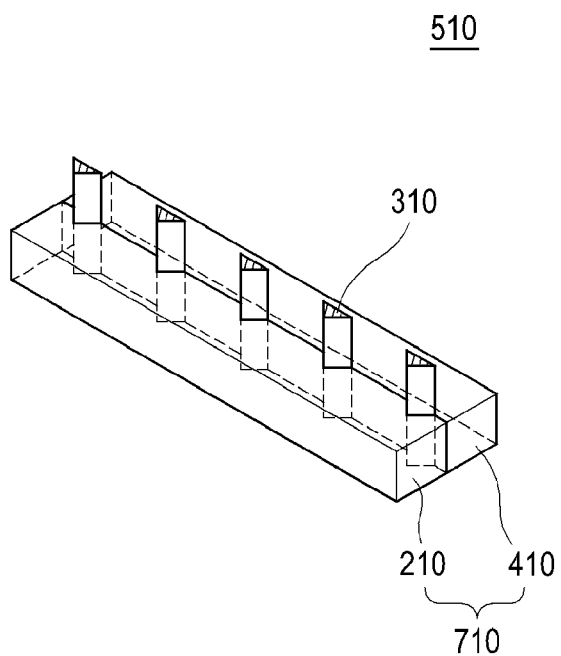
FIG. 7 shows a perspective view of one piece of the layered structure illustrated in FIG. 6 with an upper part of the first and second layers removed.

FIG. 6 shows a perspective view of one of the four pieces (e.g., piece 510) of layered structure 400 positioned in an upright position. Piece 510 has an array of nano needles 310 between first layer 210 and second layer 410. A mechanical processing unit (e.g. a robot arm) may be used to rotate piece 510 to be positioned in an upright position (about 90 degrees). FIG. 7 shows a perspective view of piece 510 of layered structure 400 having an upper part of the first and second layers removed. An upper part of first layer 210 and an upper part of second layer 410 are removed to expose nano needles 310 therein. The remaining portions of first layer 210 and second layer 410 (the remaining bottom portions of first layer 210 and second layer 240) form a body part 710 to which nano needles 310 are affixed or attached. The upper parts of first layer 210 and second layer 410 of piece 510 may be selectively removed using any of a variety of well-known etching techniques to thereby expose portions of nano needles 310. For example, an anisotropic chemical wet etching technique may be used to etch and remove the upper parts of first layer 210 and second layer 410 of piece 510. During the etching process, the bottom part of piece 510 may be attached to a holder (not shown) to secure piece 510 thereto while the upper parts or portions of first layer 210 and second layer 410 are removed. In this way, piece 510 of layered structure 400 may be processed to fabricate a nano pattern writer (e.g., nano pattern writer 120 of FIG. 1) having body part 710 and an array of nano needles 310 attached to body part 710. Although FIG. 7 shows an illustration of fabricating a nano pattern writer having one column of nano needles 310, it should be appreciated that a nano pattern writer having two or more columns of nano needles 310 can be manufactured. For example, one piece (e.g., piece 510 of FIG. 5) of layered structure 400 may be secured to another piece (e.g., piece 520 of FIG. 5) of layered structure 400 in such a way that nano needles 310 may be aligned to form an integrated structure with two columns of nano needles (i.e., one column from piece 510 and the other column from piece 520). The upper parts of the integrated structure with two columns of nano needles may be removed to expose an array of nano needles in piece 510 and piece 520, thereby producing a nano pattern writer having two or more columns of nano needles.

Figure 8:
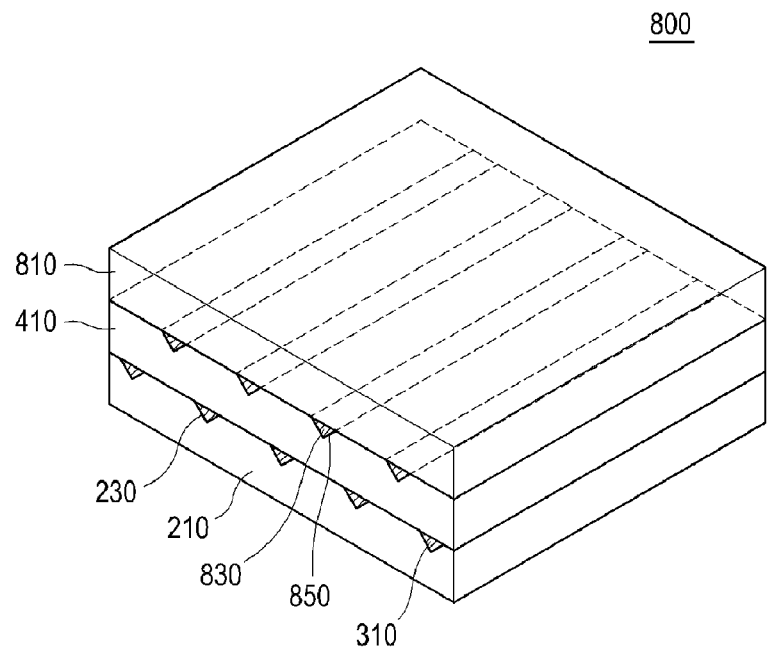
FIG. 8 shows a perspective view of an illustrative embodiment of a three-layered structure.

FIG. 8 shows a perspective view of an illustrative embodiment of a three-layered structure 800 having a third layer 810 placed on second layer 410. One or more additional grooves 830 that extend along the length of second layer 410 may be formed on second layer 410. The additional grooves 830 may be formed in a similar manner as grooves 230 described above with reference to FIG. 2. The scale/dimension/shape (e.g. width and depth of each groove, a cross-sectional shape of each groove, center-to-center spacing between two adjacent grooves, or the like) of one or more additional grooves 830 formed on second layer 410 may be substantially identical to that of grooves 230 formed on first layer 210. As depicted, one or more additional grooves 830 on second layer 410 may extend substantially in parallel with grooves 230 on first layer 210. In some embodiments, one or more additional grooves 830 on second layer 410 may have a pattern substantially identical to the pattern of one or more grooves 230 on first layer 210. In some embodiments, one or more additional grooves 830 may also have a linear pattern that alternates with the linear pattern of one or more grooves 230. For example, one or more additional grooves 830 may be formed at a position that is horizontally shifted, e.g., rightward, by a predetermined distance or dimension (e.g., a half of the center-to-center spacing between two adjacent grooves) from a position at which one or more grooves 230 is formed. It should be appreciated that although FIG. 8 shows one or more additional grooves 830 that extend linearly with a substantially uniform center-to-center spacing between two adjacent additional grooves, depending on the design specifications, one or more additional grooves 830 may be disposed in varying directions having different patterns, and/or the center-to-center spacing between two adjacent additional grooves. Moreover, the patterns of one or more additional groves 830 may vary (e.g., one pair of two adjacent additional grooves may be spaced closer together than another pair of two adjacent additional grooves) from that depicted in FIG. 8.

In a manner similar to forming a film filling one or more grooves 230 described above with reference to FIG. 3, a film may be deposited in one or more additional grooves 830 to form an additional array of nano needles 850 in one or more additional grooves 830 on second layer 410. Nano needles 850 may be made of any type of hard material having a predetermined hardness. For example, nano needles 850 may be made of a substance having the same hardness (e.g., the same substance) as that of nano needles 310. The hard substance is deposited on second layer 410 to form a film on a surface of second layer 410. The film of hard substance may be polished using any of a variety of well-known polishing techniques to thereby form a patterned film in grooves 830. In this way, the film may fill grooves 830 to thereby form additional arrays of nano needles 850 extending along a length of second layer 410.

Figure 9:
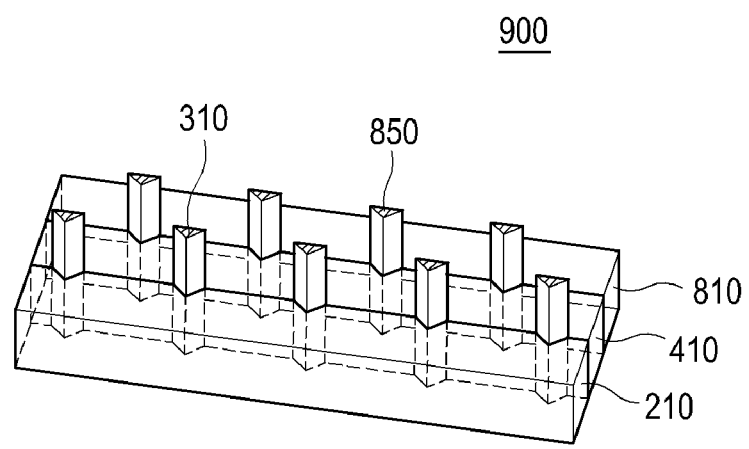
FIG. 9 shows a perspective view of a piece of a three-layered structure shown in FIG. 8 having an upper part of the three layers removed to thereby fabricate a nano pattern writer having two rows of nano needles.

FIG. 9 shows a perspective view of a piece 900 of three-layered structure 800 shown in FIG. 8 having an upper part of the three layers removed to thereby fabricate a nano pattern writer having two rows of nano needles. The two rows of nano needles may be formed by an array of nano needles 310 and an additional array of nano needles 850. In a similar manner where layered structure 400, having first layer 210 and second layer 410, is cut into multiple pieces (FIG. 5), three-layered structure 800, including first layer 210, second layer 410 and third layer 810, may be cut or divided into multiple pieces including piece 900 using any of a variety of well-known cutting techniques (e.g., using a razor blade). Piece 900 may be rotated by 90 degrees to be in an upright position. An upper part of first layer 210, second layer 410 and third layer 810 may be selectively removed using any of a variety of well-known etching techniques, to thereby expose upper portions of nano needles 310 and nano needles 850. In this way, a nano pattern writer having two columns of nano needles (i.e., one column from nano needles 310 and the other column from nano needles 850) may be fabricated using piece 900 of three-layered structure 800. It should be appreciated that although the nano pattern writer having two columns of nano needles is illustrated in FIG. 9, other different patterns of nano needles (e.g., three columns of nano needles) may be formed depending on different design specifications.

Figure 10A:
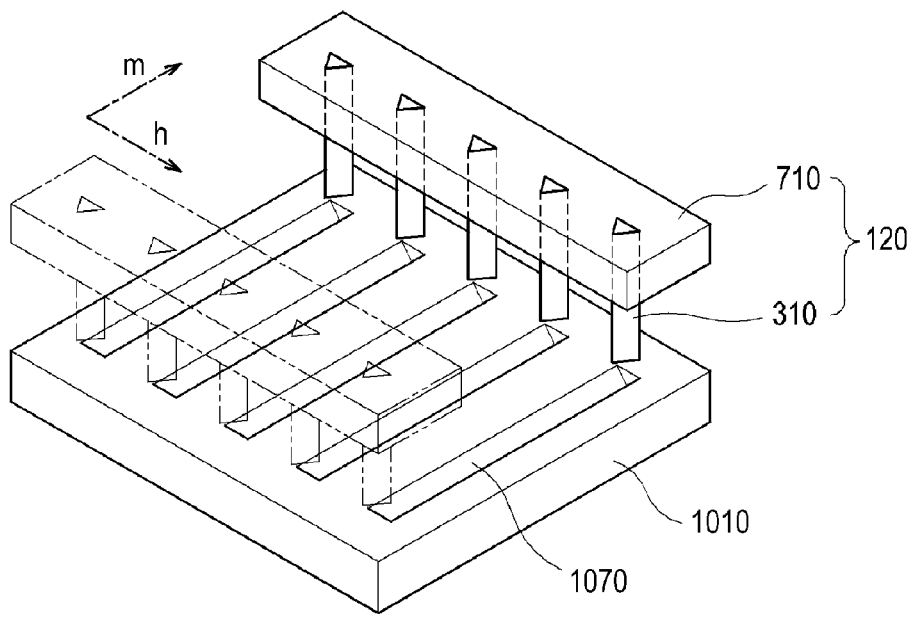
FIGS. 10A and 10B show perspective views illustrating a process for forming a nano pattern on a plate using the nano pattern writer illustrated in FIG. 7.
Figure 10B:
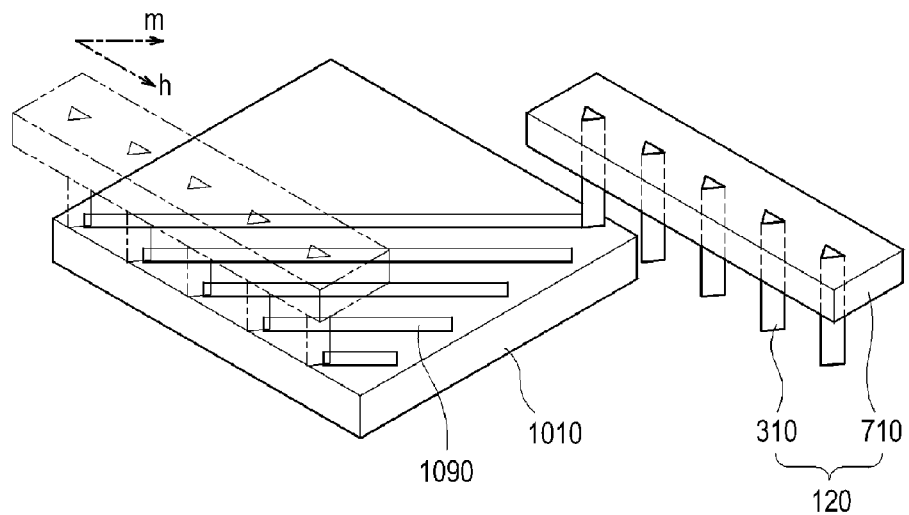

FIGS. 10A and 10B show perspective views illustrating a process for forming a nano pattern on a plate using a nano pattern writer (e.g., nano pattern writer of FIG. 7). As depicted, nano pattern writer 120, having body part 710 and an array of nano needles 310 attached to body part 710, may be moved in a direction "m." Nano pattern writer 120 may be moved using any type of mechanical processing unit (e.g., a robot arm) that will allow the array of nano needles 310 to scratch a surface of a plate 1010. Moving nano pattern writer 120 forms a nano pattern 1070 and a nano pattern 1090 in the surface of plate 1010 (FIGS. 10A and 10B, respectively). Plate 1010 may include, but not be limited to, glass, a semiconductor substrate, a photoresist or the like. In one embodiment, nano pattern writer 120 may be moved on the surface of plate 1010 in a direction "m" substantially perpendicular to a direction "h" in which nano pattern writer 120 extends. This movement forms nano pattern 1070 having multiple lines that are aligned along a length of plate 1010 (FIG. 10A). Two adjacent needles of nano needles 310 may have a center-to-center spacing ranging from about 5 nm to about 30 nm, from about 10 nm to about 50 nm, from about 15 nm to about 70 nm, or from about 20 nm to about 100 nm. The center-to-center spacing of the nano needles may determine the spacing of the lines in nano pattern 1070. As the center-to-center spacing of nano pattern writer 120 becomes wider, the spacing of the lines in nano pattern 1070 formed by nano pattern writer 120 may become larger.

Alternatively, nano pattern writer 120 may be moved on a surface of plate 1010 in a direction "m" forming an acute angle (e.g., about 45 degrees) relative to a direction "h" in which nano pattern writer 120 extends to thereby form nano pattern 1090 having multiple lines that are obliquely aligned on plate 1010 (FIG. 10B). In this embodiment, nano pattern writer 120 is moved at an acute angle relative to direction "h" in which nano pattern writer 120 extends (e.g., toward an upper right direction on the surface of plate 1010) to thereby create or form nano pattern 1090 having a finer line spacing than the line spacing of the nano pattern 1070. It should be appreciated that although FIGS. 10A and 10B illustrate a method of forming a nano pattern on plate 1010 by moving nano pattern writer 120 having an array of nano needles 310 in a predetermined direction, any of a variety of nano patterns may be formed using a different arrangement (e.g., rectangular pattern) of nano needles in a nano pattern writer, and/or moving such nano pattern writer in various directions (e.g., in a zigzag path). A nano pattern writer having multiple columns of nano needles that are arranged in a rectangular shape may be pressed toward a surface of plate 1010 to thereby form a nano pattern having multiple points corresponding to positions of multiple columns of nano needles of the nano pattern writer.

FIG. 11 is a flow diagram of an illustrative embodiment of a method for manufacturing a nano pattern writer (e.g., nano pattern writer of FIG. 7). In block 1110, first layer 210 is prepared for forming one or more grooves to include an array of nano needles of the nano pattern writer. In block 1120, one or more grooves 230 are formed on first layer 210. First layer 210 may be processed to define one or more grooves 230 that extend along a length of first layer 210 using any of variety of well know etching techniques. As described above, one or more grooves 230 formed in first layer 210 may be disposed in a substantially uniform manner with a predetermined center-to-center spacing "s" between adjacent grooves (FIG. 2). The center-to-center spacing "s" may determine the spacing between adjacent lines in the nano pattern to be formed using nano pattern writer 120. Cross-sectional shapes of one or more grooves 230 may vary based on the design requirements/specification of the nano pattern writer to be used in nano pattern writing device 100.

In block 1130, a hard substance is deposited on first layer 210 to form a film on a surface of first layer 210. The film is deposited onto first layer 210 and fills one or more grooves 230 to form nano needles 310. Nano needles 310 may be made of any of a variety of materials having a hardness greater than or equal to a predetermined hardness sufficient to scratch a surface of a plate to be patterned. In block 1140, the film may be polished using any of a variety of well-known polishing techniques to thereby form a patterned film that fills one or more grooves 230 in first layer 210. During the polishing process, a part of the film that is formed on a flat surface of first layer 210 between grooves 230 is removed, thereby leaving a part of the film disposed within grooves 230. In this way, the film may fill grooves 230 of first layer 210 to thereby form nano needles 310. In block 1150, second layer 410 may be placed or deposited on top of first layer 210 to form layered structure 400. During the deposition, layered structure 400 may be pressed while being heated to ensure good adhesion between first layer 210 and second layer 410.

In block 1160, layered structure 400 may be divided into multiple pieces (e.g., pieces 510, 520, 530, 540 of FIG. 5). Layered structure 400 may be cut in a direction substantially perpendicular to the direction in which grooves 230 extend (i.e. where cutting angle α in FIG. 5 is about 90 degrees). Alternatively, layered structure 400 may be cut diagonally at an acute cutting angle relative to the direction in which grooves 230 extend (i.e. where cutting angle α is less than 90 degrees). In block 1170, a part of first layer 210 and second layer 410 included in piece 510 may be selectively removed using any of a variety of well-known etching techniques. The etching of the part of first layer 210 and second layer 410 exposes portions of nano needles 310 disposed between first layer 210 and second layer 410. In this way, first piece 510 may be processed to fabricate nano pattern writer 120 having nano needles 310.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 12:
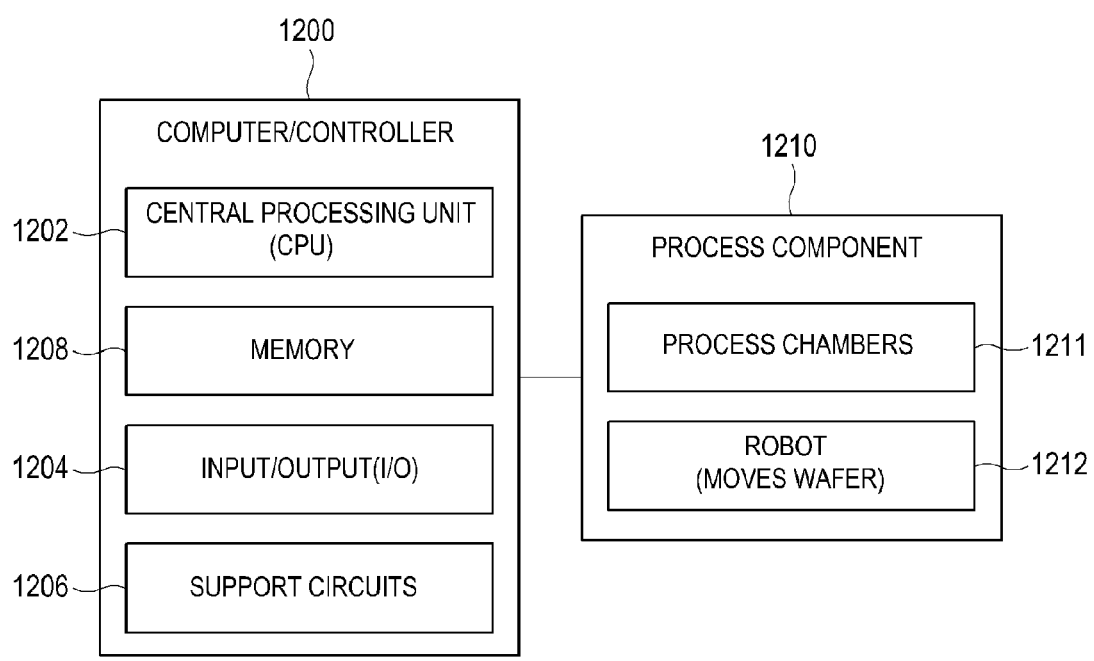
FIG. 12 shows a block diagram of an illustrative embodiment of a computer/controller for controlling the operations of the methods illustrated in FIG. 11.

FIG. 12 shows a block diagram of an illustrative embodiment of a computer or a controller that can control the operations of the process illustrated in FIG. 11. As depicted, a computer/controller 1200 is coupled to a process component ("fab") 1210. Process component 1210 includes any of a variety of process chambers 1211 in which a substrate or a plate is processed using robot mechanism 1212 to move a wafer. The processing varies based on the depth/width of materials that are deposited. Patterns may then be etched and imprinted using chemical vapor deposition, physical vapor deposition, electrochemical deposition, and reactive ion etching (RIE), which are known for depositing and/or etching specific materials within process component 1210. Computer/controller 1200 includes a central processing unit (CPU) 1202, a memory 1208, support circuits 1206, and input/output (I/O) circuits 1204. CPU 1202 may be a general purpose computer that, when programmed to execute software contained in memory 1208, becomes a specific purpose computer configured to control the hardware and/or components of process component 1210. Memory 1208 may include Read-Only-Memory (ROM), Random Access Memory (RAM), removable storage, a hard disk drive, or any other digital memory device. I/O circuits 1204 may include well-known displays suitable to display or output information, while a keyboard, mouse, track ball, or other input device can allow for appropriate programming of computer/controller 1200 to determine the processes to be performed by (i.e., control) process component 1210 (including the associated action performed by robot 1212 included in process component 1210). Support circuits 1206 are well-known in the art and include circuits such as cache, clocks, power supplies, or the like. Memory 1208 contains control software that, when executed by CPU 1202, enables computer/controller 1200 to digitally control the various components of process component 1210. In another embodiment, computer/controller 1200 may be analog. For instance, application specific integrated circuits are capable of controlling processes such as those which occur within process component 1210.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," or the like include the number recited and refer to ranges which can be subsequently broken down into subranges as discussed above.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A method for manufacturing a nano pattern writer, the method comprising:
    forming one or more grooves on a first layer;
    depositing a substance on the first layer to form a film on the first layer, such that at least a portion of the film is effectively deposited in the one or more grooves;
    after forming the film, polishing the film on the first layer to yield a patterned film that fills the one or more grooves on the first layer;
    placing a second layer over the patterned film to thereby form a layered structure interposing the patterned film between the first layer and the second layer; and
    removing a part of the first layer and the second layer to thereby expose portions of the patterned film.

2. The method of claim 1, further comprising:
    cutting the layered structure into a first piece and a second piece; and
    removing a part of the first piece to thereby expose portions of the patterned film in the first piece.

3. The method of claim 2, further comprising:
    attaching the first piece to the second piece to thereby allow the patterned film in the first piece and the patterned film in the second piece to be substantially parallel to each other; and
    removing a part of the first and the second pieces to thereby reveal portions of the patterned film.

4. The method of claim 1, wherein the substance has a hardness equal to or greater than 7 on the Mohs scale.

5. The method of claim 1, wherein the film comprises at least one of quartz, tungsten, tungsten carbide, tantalum carbide, diamond, or titanium alloys.

6. The method of claim 1, wherein the one or more grooves has a depth ranging from about 5 nm to about 30 nm, and a width ranging from about 10 nm to about 50 nm.

7. The method of claim 1, wherein the one or more groove has a substantially triangle-shaped cross-section.

8. The method of claim 2, wherein cutting the layered structure comprises cutting the layered structure in a direction substantially perpendicular to a direction in which the one or more grooves extend.

9. The method of claim 1, wherein a center-to-center spacing between two adjacent grooves of the one or more grooves ranges from about 5 nm to about 30 nm.

10. The method of claim 1, wherein the one or more grooves on the first layer each extend substantially in parallel to have a substantially linear pattern.

11. The method of claim 1, further comprising:
    forming one or more additional grooves on the second layer;
    depositing an additional film on the second layer;
    polishing the additional film on the second layer to thereby pattern the additional film to form an additional patterned film on the second layer;
    placing a third layer on the additional patterned film to thereby form a layered structure interposing the additional patterned film between the second layer and the third layer; and
    removing a part of the third layer to thereby expose portions of the additional patterned film.

12. The method of claim 11, wherein the one or more additional grooves on the second layer extend substantially in parallel to have a substantially linear pattern.

13. The method of claim 11, wherein the one or more additional grooves on the second layer have a substantially identical pattern to a pattern of the one or more grooves on the first layer.

14. A method for forming a nano pattern, the method comprising:
    positioning a nano pattern writer having an array of nano needles over a plate; and
    moving the nano pattern writer on the plate to thereby allow the array of nano needles to scratch a surface of the plate.

15. The method of claim 14, wherein moving the nano pattern writer includes moving the nano pattern writer in a direction in which the plate extends.

16. The method of claim 14, wherein moving the nano pattern writer includes moving the nano pattern writer in a direction having a predetermined angle from the direction in which the plate extends.

17. The method of claim 14, wherein a center-to-center spacing between two adjacent needles of the array of nano needles ranges from about 5 nm to about 30 nm.

* * * * *

UNITED STATES PATENT AND TRADEMARK OFFICE
CERTIFICATE OF CORRECTION

| | | |
|---|---|---|
| PATENT NO. | : 8,062,568 B2 | Page 1 of 1 |
| APPLICATION NO. | : 12/548959 | |
| DATED | : November 22, 2011 | |
| INVENTOR(S) | : Lee | |

It is certified that error appears in the above-identified patent and that said Letters Patent is hereby corrected as shown below:

In Column 9, Line 32, delete "electrochemical" and insert -- electro-chemical --, therefor.

Signed and Sealed this
Eighteenth Day of September, 2012

David J. Kappos
*Director of the United States Patent and Trademark Office*